(12) United States Patent
Raz

(10) Patent No.: US 7,173,555 B2
(45) Date of Patent: Feb. 6, 2007

(54) METHOD AND SYSTEM FOR NONLINEAR AND AFFINE SIGNAL PROCESSING

(75) Inventor: Gil M. Raz, Concord, MA (US)

(73) Assignee: GMR Research & Technology, Inc., Concord, MA (US)

( * ) Notice: Subject to any disclaimer, the term of this patent is extended or adjusted under 35 U.S.C. 154(b) by 0 days.

(21) Appl. No.: 11/280,863

(22) Filed: Nov. 16, 2005

(65) Prior Publication Data

US 2006/0132345 A1 Jun. 22, 2006

Related U.S. Application Data

(60) Provisional application No. 60/628,218, filed on Nov. 16, 2004.

(51) Int. Cl.
*H03M 1/12* (2006.01)

(52) U.S. Cl. ...................... 341/155; 341/143; 375/341; 375/297

(58) Field of Classification Search ......... 341/130–170
See application file for complete search history.

(56) References Cited

U.S. PATENT DOCUMENTS 6,639,537 B1 * 10/2003 Raz ............................ 341/155

* cited by examiner

*Primary Examiner*—Rexford Barnie
*Assistant Examiner*—Lam T. Mai
(74) *Attorney, Agent, or Firm*—Kriegsman & Kriegsman

(57) ABSTRACT

A method of nonlinear and affine signal processing includes the steps of introducing an input signal into a system which exhibits nonlinear behavior, the input signal including a target signal and a secondary signal. By virtue of its nonlinear design, the system generates nonlinear artifacts of the target signal and the secondary signal. These nonlinear artifacts are in turn used as a novel form of signal diversity. In one embodiment, the identification of the nonlinear artifacts is used to resolve defects that have been created as a result of sub-Nyquist sampling. In another embodiment, the identification of the nonlinear artifacts is used to locate and strengthen the power of a target signal that falls beneath the noise threshold for the system.

19 Claims, 8 Drawing Sheets

METHOD AND SYSTEM FOR NONLINEAR AND AFFINE SIGNAL PROCESSING

CROSS-REFERENCE TO RELATED APPLICATIONS

The present application claims the benefit under 35 U.S.C. 119(e) of U.S. provisional Patent Application Ser. No. 60/628,218, filed Nov. 16, 2004, the disclosure of which is incorporated herein by reference.

BACKGROUND OF THE INVENTION

The present invention relates generally to nonlinear systems and more particularly to methods and systems for processing signals generated from nonlinear systems.

Virtually all practically engineered and/or natural systems experience nonlinear behavior. As defined herein, a nonlinear system is a system which exhibits a nonlinear relationship between its input and output (i.e., the system fails to obey the principal of superposition between its input and output). Examples of systems which exhibit nonlinear behavior include, inter alia, most biological systems, fluid flow systems, optical systems, imaging systems, RF receiver and transmitter systems, magnetic devices and magnetic recording systems, analog electronic systems, amplifier systems, loud speaker systems and radar systems.

A signal output from a nonlinear system typically includes a nonlinear component. As defined herein, use of the term signal in conjunction with nonlinear systems is meant to denote both (1) the mathematical description of any measurable phenomena in nature or in human-made systems and (2) the mathematically described function of one or more variable depending on one or more parameters. Examples of signals include, inter alia, light intensity, voltage, pressure, magnetic field strength and electric field strength.

Nonlinearities inherent in a particular system introduce nonlinear distortion products (e.g., harmonics, intermodulations, spurs, etc.) into the output signal generated by said system. In turn, the introduction of these nonlinear distortion products may limit the ability of signal processors to separate the desired component of the output signal (typically the linear component) therefrom, thereby effectively compromising the overall performance of the system, which is highly undesirable.

In particular, in the field of digital signal communications, nonlinear signal distortion is traditionally regarded as undesirable behavior which limits the performance of the overall system. As a result, nonlinear signal products are often treated in at least one of the following ways: (1) by reducing the nonlinear properties of selected devices within the system (often at a significant expense in cost) and/or (2) by minimizing the nonlinear distortion products present in the output signal using a nonlinear equalizer (NLEQ) digital signal processor at its back end (which often requires complex mathematical processes).

An example of one well-known type of NLEQ digital signal processor is disclosed in U.S. Pat. No. 6,639,537 to G. M. Raz (hereinafter the '537 patent), the disclosure of which is incorporated herein by reference. In the '537 patent, there is disclosed a highly linear analog-to-digital (ADC) conversion system that has an analog front-end device in cascade with a standard ADC converter, and a tunable digital nonlinear equalizer. The equalizer corrects the quantization distortion, deviations from ideal response, and additive noises generated by the analog front-end device and ADC converter.

Another example of a NLEQ digital signal processor is disclosed in a co-pending U.S. patent application entitled, "Method and System of Nonlinear Signal Processing" which was filed on even date herewith in the names of Gil M. Raz and Cy P. Chan (also referred to herein as simply "the Raz/Chan application"), the entirety of said disclosure being incorporated herein by reference.

One well-known system which typically experiences nonlinear irregularities is a receiver system (also referred to herein simply as a receiver). Referring now to FIG. 1, there is shown a simplified schematic representation of a receiver 11 which is well known in the art. Receiver 11 comprises an antenna 13 for receiving an analog signal s(n), an analog, low-noise, front end device 15 (e.g., a low-noise amplifier, mixer and/or filter) for conditioning (e.g., filtering and/or amplifying) analog signal s(n), and an analog-to-digital converter (ADC) 17 for converting the conditioned analog signal into a distorted, received digital output signal x(n). As can be appreciated, digital output signal x(n) includes certain nonlinear distortion products (e.g., harmonics, intermodulation products, etc.) which were created by front end device 15 and/or ADC 17.

Referring now to FIG. 2, there is shown a sample digital output signal x(n) generated in response to the injection of an analog input signal s(n) into nonlinear receiver system 11, said output signal x(n) being represented in terms of power as a function of frequency. As can be seen, the output signal x(n) includes a two tone signal (identified herein as the "target signal") which represents the linear component (i.e., the desired component) of the digital output signal x(n). Under ideal conditions, the output signal x(n) generated by receiver system 11 would include only the target signal. However, imperfections inherent in the actual conditions tend to introduce a number of additional signal components in the output signal x(n), these additional signal components often compromising the usable portion of the target signal which can be used for processing and/or analysis (this usable portion of the target signal being used to define the dynamic range for the receiver).

Specifically, a plurality of factors typically influence the ability of receiver system 11 to accurately transform an incoming analog signal s(n) into a corresponding digital output signal x(n). Some of the factors which influence the overall performance of receiver 11 include, among other things:

(A) Noise—Noise is typically a broadband signal which is generated by various environmental effects (e.g., thermal noise) and/or man-made sources and is always present in physical environments. With respect to receiver 11, analog front end device 15 is typically responsible for the introduction of a considerable noise component into the output signal x(n). As can be seen in FIG. 2, the introduction of noise into the output signal (said noise component being identified simply as "noise" in FIG. 2) significantly reduces the usable portion of the target signal that can be used for processing, said usable portion being quantified typically by the signal-to-noise ratio (SNR). As a result, the signal-to-noise ratio is often utilized as one means for measuring the sensitivity of a receiver. Accordingly, in an effort to maximize the signal-to-noise ratio of a receiver (and thereby improve its sensitivity), receiver design engineers often utilize particular receiver components that produce low noise levels, often at a considerable expense in manufacturing costs for the overall system.

(B) Nonlinear Distortion Products—As described in detail above, systems which exhibit nonlinear behavior typically introduce nonlinear distortion products (e.g., harmonics, intermods, etc.) into their output signal. With respect to receiver 11, nonlinear distortion products are typically introduced into the output signal due to the nonlinear properties of analog front end device 15 and/or analog-to-digital converter 17. Additionally, the channel through which the signals arrive may have nonlinear characteristics as is the case with fiber optical communications systems. One type of nonlinear distortion product commonly produced by receiver systems is an intermodulation product, or intermod, (which is identified in FIG. 2 as "intermodulation products"). An intermodulation product is a form of a cross-modulation in which nonlinearities inherent in receiver 11 causes the target signal to appear to be modulated by an undesired signal (e.g., an interference signal). More generally, any spurious (spur) signal caused by the nonlinear system is a source of distortion to the desired signal and is characterized by the spur free dynamic range (SFDR). As can be seen in FIG. 2, the introduction of intermodulation products into the output signal x(n) significantly reduces the usable portion of the target signal that can be used for processing, said usable portion being quantified and identified simply as the intermodulation-free dynamic range (IFDR). Accordingly, in an effort to maximize the SFDR or IFDR of a receiver (and thereby improve its overall performance), receiver design engineers utilize various techniques for reducing nonlinear distortion products, some of said techniques being described in detail above.

(C) Interference Signals—An interference signal is an unwanted signal that often affects the ability of a system to isolate the desired component (i.e., the target signal) of a receiver's output signal. With respect to receiver 11, interference signals may either be natural or man-made, wherein man-made interference signals may be further characterized as either unintentional or intentional (e.g., a jammer signal). As can be appreciated, there are different well-known methods for treating (e.g., filtering) interference signals. For example, if an interference signal is well-defined in the frequency domain, digital signal processors often notch out the particular frequency band in which the interference signal lies. This process can be undesirable for numerous reasons including, inter alia, the circumstance when a portion of the target signal falls within the frequency range of the interference signal.

(D) Sampling rate—A sampling rate is defined as the rate at which an analog signal (a continuous-time signal) is sampled (e.g., in samples per second) in order to represent said analog signal in digital form. With respect to receiver 11, the sampling rate at which analog-to-digital converter 17 samples (i.e., digitizes in discrete time) the analog input signal s(n) as part of its signal conversion process can factor into the overall performance of receiver 11. Specifically, if the sampling rate chosen for ADC 17 is too high, the noise produced by receiver 11 often increases to an unacceptable level. Generally, the higher the sample rate in an ADC, the lower its commensurate SNR and SFDR. In addition, a high sampling rate typically increases the power requirement for receiver 11, thereby increasing costs. To the contrary, if the sampling rate chosen for ADC 17 is too low, aliasing may occur in the output signal x(n). Simply stated, aliasing relates to both: (1) the loss of some frequencies of the original signal when sampled at a slow rate and (2) the generation of frequency-shifted replicas of a target signal when the digitized signal is reconstructed as a continuous time signal. As will be shown in detail below, signal replicas caused from aliasing often create ambiguities and/or mixing with the target signal, which is highly undesirable.

Consequently, the sampling operation of an analog-to-digital converter is typically performed in accordance with the sampling theorem to ensure accurate representation and reconstruction of an analog signal in digital form. The sampling theorem states that, if the bandwidth of the received signal is f HZ, then at least two samples per cycle are needed for this component. In other words, the sampling rate must be at least 2f, said sampling rate being commonly referred to in the art as the Nyquist rate.

Use of the term affine in the context of the present invention refers to any addition of externals signals to the target signal, whether inadvertently (e.g., the presence of jammer signals) or by design using probe signals injected into the system by the system itself.

Nonlinear distortions are typically viewed as detrimental to system performance due to the creation of nonlinear distortion products (e.g., harmonics, intermods, spurs, etc.) which overlap the desired signals.

Interference signals caused by sources other than the target signal source are also typically considered to be detrimental to system performance. Strong interference signals are often referred to as jammers and clutter in the context of radar.

SUMMARY OF THE INVENTION

It is an object of the present invention to provide a novel method and system for nonlinear and affine signal processing.

It is another object of the present invention to provide a method and system as described above which can be used to improve the performance of systems that exhibit nonlinear behavior and/or strong interference signals.

It is yet another object of the present invention to provide a method and system as described above which utilizes mathematical modeling tools which are neither cumbersome nor computationally complex in nature.

Therefore, according to one feature of the present invention, there is provided a system for processing an analog input signal, the analog input signal comprising a target signal and a secondary signal, said system comprising (a) an analog-to-digital converter (ADC) having a sampling rate that falls substantially beneath the Nyquist rate, said ADC converting the analog input signal to a distorted digital output signal, and (b) a digital signal processor for identifying the nonlinear artifacts of the target signal and the secondary signal, (c) wherein said digital signal processor resolves sub-Nyquist sampling defects using the identified nonlinear artifacts.

According to another feature of the present invention, there is provided a method of nonlinear and affine signal processing, said method comprising the steps of (a) introducing an analog input signal into a nonlinear system, the analog input signal being of a first bandwidth and including a target signal and a secondary signal, (b) identifying the nonlinear artifacts of the target signal and the secondary signal that are created as a result of the introduction of the analog input signal into the nonlinear system, (c) converting the analog input signal to a distorted digital output signal of a second bandwidth, wherein the second bandwidth is less than the first bandwidth, (d) expanding the distorted digital output signal from the second bandwidth to the first bandwidth, and (e) resolving signal expansion defects using the identified nonlinear artifacts.

Unlike typical approaches which attempt to reduce nonlinear behavior of each component in a system (and thereby reduce the associated nonlinear distortion products) and which further attempt to remove extraneous signals by "nulling" using temporal, spectral, and spatial methods among others (e.g., STAP, beam-forming, frequency nulling, etc.), the present invention utilizes the presence of nonlinearities in the system and strong extraneous signals to extract more information about the target signal.

This can be viewed as a novel form of signal diversity, akin to that present in multi-path communications, whereby overlapping copies of the target signal, which are traditionally viewed as a problem to be overcome, are instead utilized as a source for obtaining multiple copies of the desired target signal (albeit at the price of additional system complexity). Such signal diversity allows for better channel performance (e.g., more bits per second per hertz or fade resistance). The present invention affords a new type of signal diversity using nonlinear products which mixes the desired target signal with strong extraneous signals thereby producing multiple copies of the target signal (with modulations) thus allowing for the extraction of additional information from the received signal. We term this use of nonlinear affine processing NoLAff (pronounced "No laugh").

Various other features and advantages will appear from the description to follow. In the description, reference is made to the accompanying drawings which form a part thereof, and in which is shown by way of illustration, various embodiments for practicing the invention. The embodiments will be described in sufficient detail to enable those skilled in the art to practice the invention, and it is to be understood that other embodiments may be utilized and that structural changes may be made without departing from the scope of the invention. The following detailed description is therefore, not to be taken in a limiting sense, and the scope of the present invention is best defined by the appended claims.

BRIEF DESCRIPTION OF THE DRAWINGS

In the drawings wherein like reference numerals represent like parts.

DETAILED DESCRIPTION OF THE PREFERRED EMBODIMENT

Figure 1:
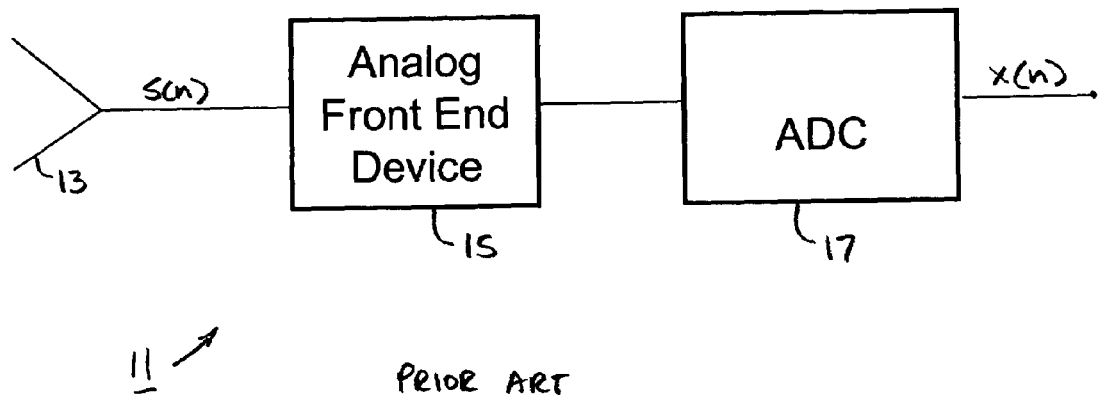
FIG. 1 is a simplified block diagram of a receiver system which is well known in the art.
Figure 2:
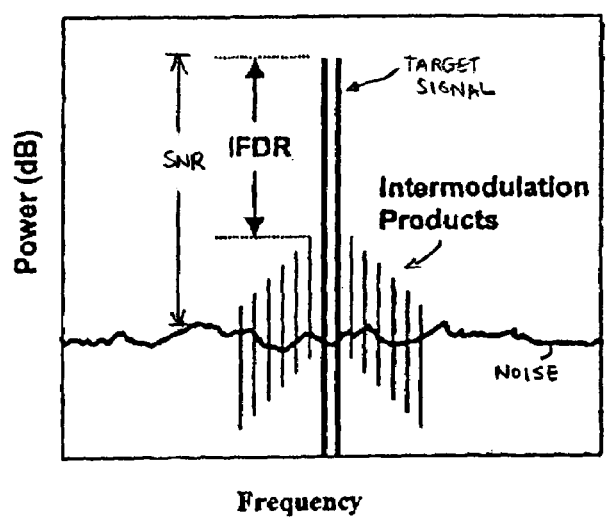
FIG. 2 is a graphical representation of a digital output signal which is the result of the transmission of a two tone analog input signal through the nonlinear receiver system shown in FIG. 1.

As will be described in detail below, the general principal behind the present invention relates to the exploitation of nonlinearities in a system to create a novel form of signal diversity. Specifically, a system that exhibits nonlinear behavior typically produces an output signal which includes both a linear component and a nonlinear component. Traditionally, the linear component is regarded as the target, or desired, component of the output signal (and, as a consequence, is enhanced to the greatest extent possible) and the nonlinear component is regarded as the undesirable component of the output signal (and, as a consequence, is minimized to the greatest extent possible).

Contrary to traditional practice, the present invention welcomes (and may actually enhance) the nonlinear component of the receiver's output signal based on the information that it can provide. Moreover, interference signals (which in common practice are deemed to be detrimental to the performance of a system) may also yield useful information in conjunction with the nonlinearities of the systems or the signal channel. In some cases where nonlinearities are present in the system, it may indeed be beneficial to artificially add strong known interference signals such that their nonlinear interaction with the target signal provides additional information about the target signal. In fact, this additional information may be used to enhance the target signal to a greater extent than previously possible.

Without additional processing, strong interference signals can have detrimental effects on a system. However, strong interference signals have an inherent benefit of being easily measured with great accuracy relative to weak target signals. Accordingly, the information about interference signals (and indeed with artificially added probe signals which are known a priori with great accuracy) and about the system's nonlinear characteristics can be used with respect to the nonlinear products of the strong interference signals with the target signal. In essence, these cross-products are a modulated copy of the target signal and can be used to extract more information about the target signal than would otherwise be available.

The process of identifying the nonlinear characteristics of a system can be accomplished in several ways. A particularly accurate and parsimonious method of identification is described in the '537 patent as well as in the Raz/Chan application.

Extraction of information from the cross-products of the interference signals and the target signal can be accomplished in multiple ways and the details of the optimal extraction method will depend on the particular application, system and desired information of the target signal. Two practical applications for the present invention are described below; however, the NoLAff method which is disclosed herein is not limited to these applications.

Very Wide Bandwidth, High Dynamic Range Receiver

The above-identified principal may be applied to a receiver system in order to improve its performance. This particular application is described in detail below. However, as noted above, the present invention is not limited to any one particular application. Rather, the above-identified principal could be implemented with any known system (either natural or practically engineered) that experiences nonlinear behavior without departing from the spirit of the present invention.

Figure 3:
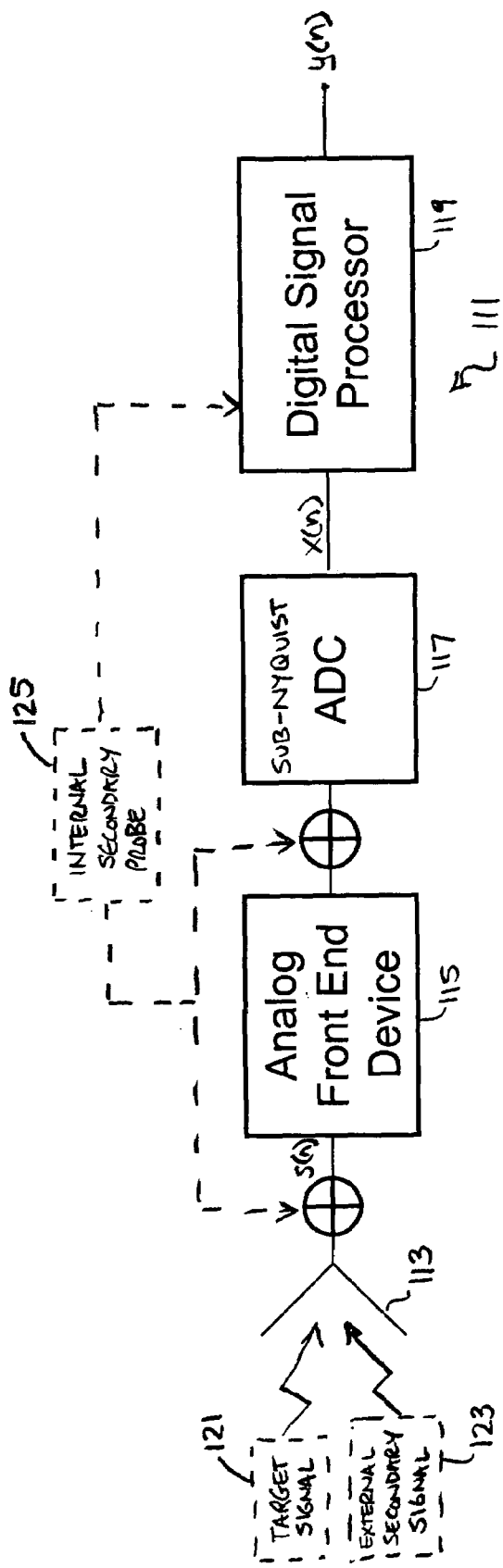
FIG. 3 is a simplified schematic representation of a novel receiver system constructed according to the teachings of the present invention.

Referring now to FIG. 3, there is shown a receiver system constructed according to the teachings of the present invention which exploits the presence of nonlinearities in its design to create a novel form of signal diversity, said receiver system being identified generally by reference numeral 111.

Receiver system 111 (also referred to simply as receiver 111) is a very wide bandwidth, high dynamic range receiver. Receiver 111 comprises an antenna 113 for receiving an analog signal s(n), a front end device 115 for conditioning analog signal s(n), an analog-to-digital converter (ADC) 117 for converting the conditioned analog signal into a distorted, received digital output signal x(n) and a digital signal processor 119 for minimizing nonlinearities present in distorted digital signal x(n) so as to yield an equalized digital signal y(n).

Front end device 115 is preferably a low-noise, high gain, front end device, such as an amplifier and/or mixer. It is to be understood that front end device 115 introduces a considerable degree of noise as well as nonlinear distortion into distorted signal x(n).

Analog-to-digital converter 117 preferably has a sampling rate that falls substantially beneath the Nyquist rate (wherein the Nyquist rate is two times the target signal bandwidth, or 2B). For example, ADC 117 may have a sampling rate that is beneath the Nyquist rate by a factor of 8 (i.e., a sampling rate of one-quarter the signal bandwidth, or ¼B). As a result of its relatively low sampling rate, receiver 111 operates: (1) with a high dynamic range (due to the low noise level generated from using a low sampling rate ADC) and (2) with low power and cost requirements. Yet, it should also be noted that as a result of its low sampling rate, ADC 117 may generate aliasing in digital signal x(n), which is highly undesirable. However, it will be shown that the presence of aliasing in digital signal x(n) can be suitably treated by digital signal processor 119 using the nonlinear component of signal x(n).

Digital signal processor 119 may be implemented using very large-scale integration (VLSI) architecture, field programmable gate arrays or any other device which computes results at a rate commensurate with the stream of samples output by ADC 117. As will be described in detail below, processor 119 performs two principal functions: (1) to identify nonlinearities in distorted signal x(n) and, in turn, use said nonlinearities to resolve sub-sampling issues, such as aliasing, which result from using a low sample rate ADC, and (2) after said first function, to minimize said nonlinearities in distorted signal x(n) so as to yield an equalized digital signal y(n).

Antenna 113 is designed to sample a wideband signal space which is known a priori to be sparse in information content relative to the channel capacity suggested by the overall bandwidth. However, this sparse information may be very fast changing and hence the signal over any long enough period of time may use the entire wide-band spectrum. In FIG. 3, antenna 113 is shown receiving an analog target signal 121 which represents the pertinent information that is to be received by receiver 111.

Figure 4:
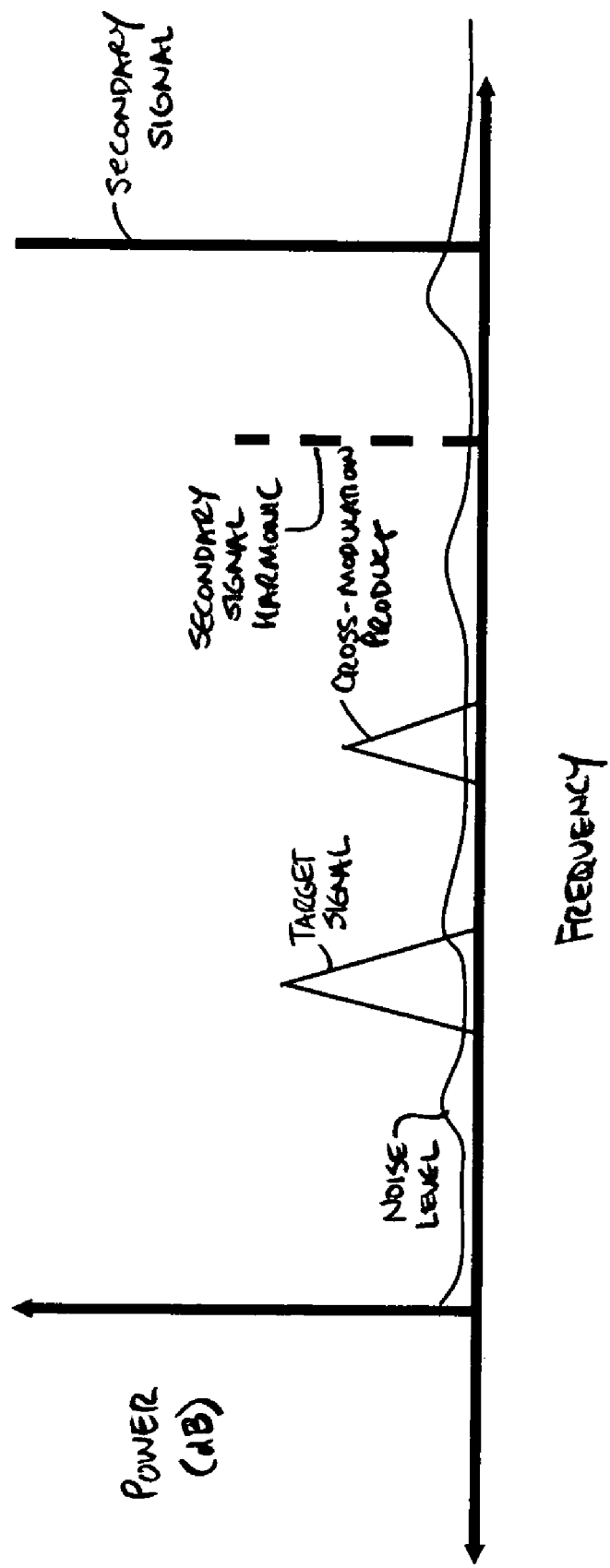
FIG. 4 is a sample graphical representation of a distorted digital output signal produced by the analog-to-digital converter shown in FIG. 3, said distorted digital output signal being shown in terms of power as a function of frequency.

It should be noted that the analog signal s(n) received by antenna 113 may additionally include an external secondary signal 123. Secondary signal 123 represents any strong externally-produced signal (e.g., an interference signal that is either intentional, such as jammer signal, or unintentional in nature). Referring now to FIG. 4, there is shown a sample graphical representation of a distorted digital output signal x(n) produced by ADC 117, said signal being shown in terms of power as a function of its low (i.e., sub-Nyquist) sample rate spectrum. As can be seen, distorted digital signal x(n) includes the target signal (which identified as such therein) as well as the secondary signal (which is identified as such therein), the secondary signal having a harmonic associated therewith (which is identified as such therein). Importantly, the nonlinearities inherent in receiver 111 serve to create a cross-modulation product between the target signal and the secondary signal (said cross-modulation product being defined as such therein). The identification of said cross-modulation product can then, in turn, be used to provide useful information relating to the target signal. This information can be used to enhance the strength of the target signal relative to the noise level (which is identified as such therein), which is highly desirable.

To optimize the ability of receiver 111 to use cross-modulation products to enhance the strength of a target signal, it is preferred that external secondary signal 123 have at least some of the following characteristics: (1) a relatively high strength level (but without overwhelming system 111); (2) a narrow bandwidth which is well-defined within a particular sub-space (so as to render analysis easier); and (3) multiple distinct subspace or bandwidths (so as to increase the total amount of information that can be accumulated).

Rather than rely on the presence of an externally-produced secondary signal, receiver system 111 may alternatively inject a known, internally-produced secondary signal 125 in place thereof. The internally-produced secondary signal 125 (also referred to herein simply as probe signal 125) is preferably injected into the particular bandwidth at any point prior to ADC 117. For purposes of simplicity only, FIG. 3 represents probe signal 125 as being mixed with the target signal at either of two different locations during the signal transformation process (i.e., prior to the target signal being conditioned by front end device 115 and immediately after the target signal is conditioned by front end device 115).

Identification of Nonlinearities

In order to use the nonlinearities produced by receiver system 111 as part of the above-identified context of signal diversity, it is first necessary for digital signal processor 119 to separate out the nonlinear component (i.e., the second order component) of the distorted digital output signal x(n) to the greatest extent possible.

The present invention is not limited to any one particular method of identifying the nonlinear component of a distorted digital output signal. Rather, it is to be understood that digital signal processor 119 may identify signal nonlinearities using techniques which are well-known in the art. For example, digital signal processor 119 may use the nonlinear signal mapping techniques described in U.S. Pat. No. 6,639,537 to G. M. Raz, which is incorporated herein by reference.

However, it is preferred that the present invention identify nonlinear components of a digital signal using the multidimensional signal transformation process that is described in detail in co-pending U.S. patent application entitled, "Method and System of Nonlinear Signal Processing" which was filed on even date herewith in the names of Gil M. Raz and Cy P. Chan, the entirety of said disclosure being incorporated herein by reference. The transformation of signal x(n) into multiple dimensions for the purpose of nonlinear signal mapping is described in detail below.

Figure 5A:
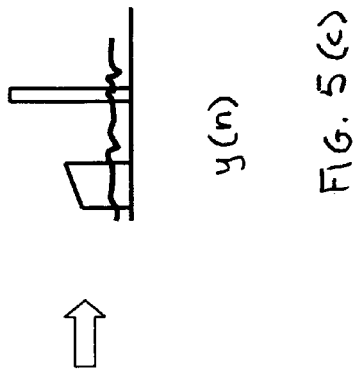
FIGS. 5(a)–5(c) are graphical representations of a sample signal shown at various times during its transmission through the receiver system shown in FIG. 3, said graphical representations being useful in displaying the benefit of performing signal mapping in multi-dimensional space.
Figure 5B:
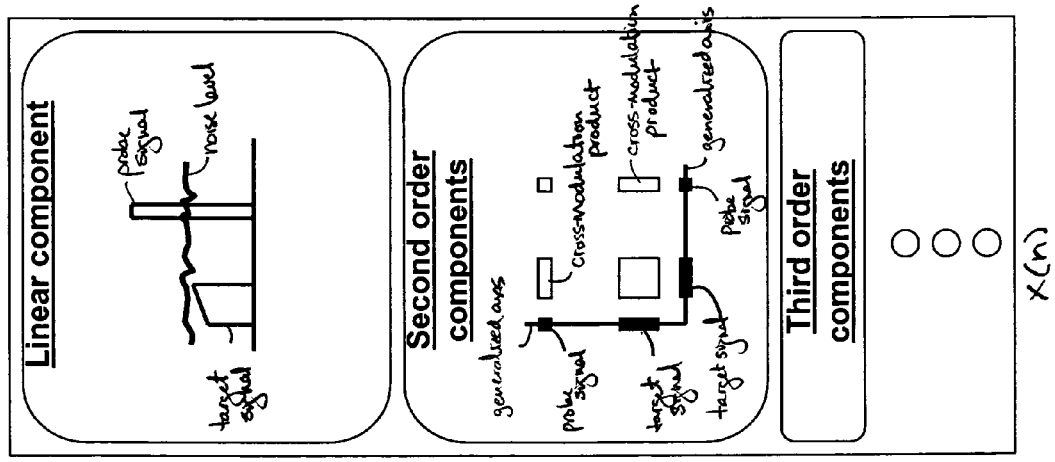
Figure 5C:
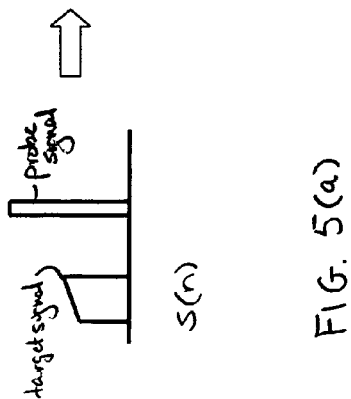

Specifically, referring now to FIGS. 5(a)–5(c), there are shown a variety of sample signal representations which are useful in displaying the benefit of performing nonlinear signal mapping in multi-dimensional space. Specifically, in FIG. 5(a), there is shown a one-dimensional representation of an analog input signal s(n) that has been transformed into the frequency domain. As can be seen, input signal s(n) includes a target signal (i.e., the desired information signal) as well as a probe signal (or other similar secondary signal).

Transmission of said input signal s(n) through front end device 115 and ADC 117 yields a distorted output signal x(n). As can be appreciated, signal x(n) includes both linear and nonlinear components which often overlap one another. Because the linear and nonlinear components of distorted signal x(n) overlap one another when said signal x(n) is represented in one-dimensional space, any linear filtering (i.e., separation) of said components is not easily achievable using traditional linear filtering techniques.

However, it is to be understood that by analyzing distorted output signal x(n) in multiple dimensions, separation of the linear and nonlinear components is more readily possible using traditional linear filtering tools (in particular, when said input signal is partitioned in a plurality of sub-space components). Specifically, referring now to FIG. 5(b), digital signal processor 119 is shown separating output signal x(n) into its linear component and its second order component.

The linear component of distorted digital signal x(n) is basically a digital representation of analog input signal s(n) but with additive noise included. As will be described further below, the additive noise can be reduced by digital signal processor 119 in order to improve the receiver sensitivity.

With the second order component of signal x(n) separated, digital signal processor 119 transforms said component into two dimensional space. As can be seen, with the second order component of signal x(n) represented in two dimensional space, the cross-modulation products between the target signal and the probe signal are easily identifiable and separable using traditional mapping techniques.

Having identified the cross-modulation products in distorted digital signal x(n), digital signal processor 119 utilizes said cross-modulation products to gain further information relating to the target signal (which may be relatively small in nature), thereby increasing the signal-to-noise level of the linear component so as to yield equalized output signal y(n).

Use of Identified Nonlinearities to Treat Aliasing and Ambiguity Problems

Figure 6:
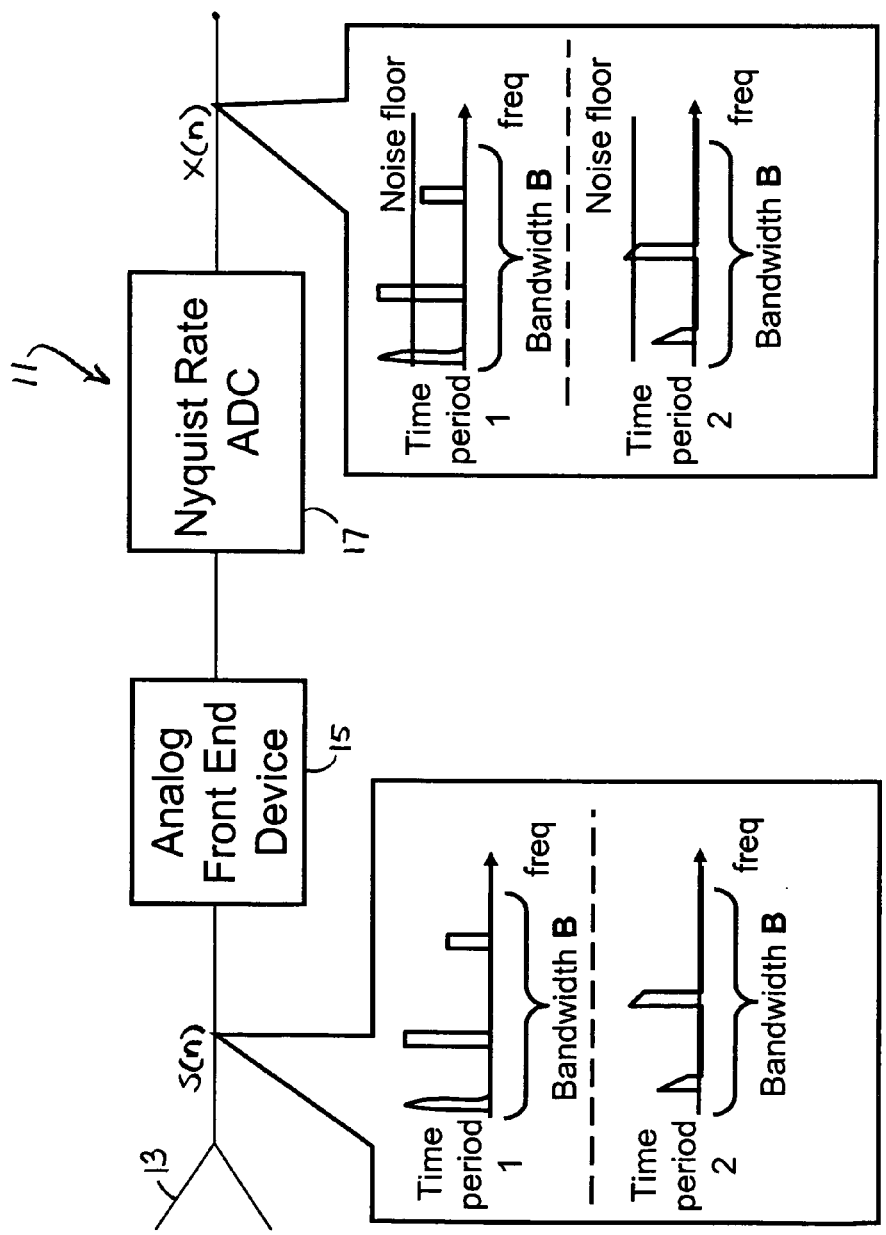
FIG. 6 is a simplified schematic representation of the prior art receiver shown in FIG. 1, the receiver being shown with graphical representations of sample signals shown at various times during their transmission through the receiver system.

Referring now to FIG. 6, there are shown graphical representations of sample signals shown at various stages during of their transmission through prior art receiver 11. As can be seen, sample input signal s(n) is shown as being introduced into prior art receiver 11 via antenna 13. As described in detail above, sample input signal s(n) is first conditioned (e.g., filtered, amplified, etc.) by front end device 15 and then converted into a distorted, received digital output signal x(n) by analog-to-digital converter 17.

It should be noted that ADC 17 has a sample rate commensurate with the Nyquist sample rate criterion; namely, a sample rate of at least twice the band of the signals received at ADC 17 (said sampling rate being represented herein as two times the bandwidth B, or 2B). As will be described further below, the use of a Nyquist sample rate ADC 17 introduces a substantial noise floor into output signal x(n), which is highly undesirable.

Figure 7:
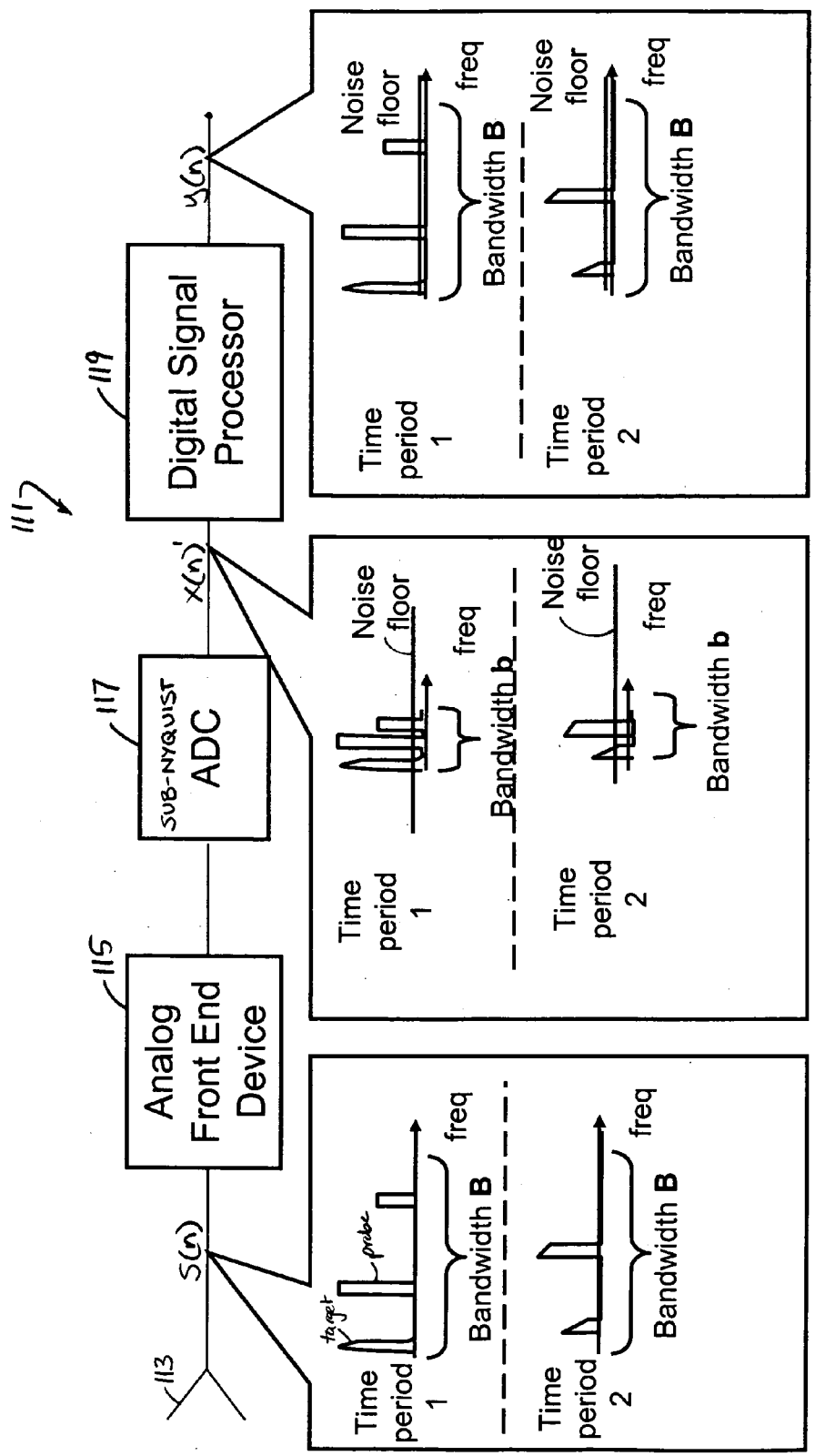
FIG. 7 is a simplified schematic representation of the receiver shown in FIG. 3, the receiver being shown with graphical representations of sample signals shown at various times during their transmission through the receiver system.

Referring now to FIG. 7, there are shown graphical representations of the same sample input signals s(n) shown in FIG. 6; however, in FIG. 7 the sample input signals s(n) are shown at various times during their transmission through novel receiver system 111, said graphical representations being useful in understanding the novel features of receiver 111.

As can be seen, sample input signal s(n) is shown as being introduced into receiver system 111 via antenna 113. Sample input signal s(n) is a wideband signal (having a bandwidth B) that includes both sparse information (i.e., target signal) as well as one or more secondary signals (i.e., externally-produced interference signals and/or internally-produced probe signals). Sample input signal s(n) is then treated by analog front end device 115 and ADC 117 in the manner as described above so as to yield a distorted digital output signal x(n)'.

As noted above, ADC 117 preferably has a sub-Nyquist sampling rate (said sampling rate being represented herein as 2b, wherein b<B). As a result of the low sample rate of ADC 117, the spectrum of the distorted output signal x(n)' is reduced substantially. Specifically, distorted output signal x(n)' is shown as having narrow bandwidth b.

It should be noted that the noise floor in distorted digital signal x(n)' is considerably low and thereby provides receiver 111 with a relatively high dynamic range. In particular, it is readily apparent that by comparing FIGS. 6 and 7, the noise floor in distorted digital signal x(n)' caused by ADC 117 is significantly lower than the noise floor in distorted digital signal x(n) caused by ADC 17. The lower noise level in digital signal x(n)' is in direct response to the use of a sub-Nyquist sampling rate ADC.

Digital signal processor 119 is then responsible for, among other things, performing spectrum expansion on the low-noise, spectrum-reduced output signal x(n)'. In particular, digital signal processor 119 is responsible for performing, inter alia, (1) reconstruction of digital signal x(n)' back to full spectrum (i.e., large bandwidth B), and (2) further improvement of the signal-to-noise ratio so as to yield the equalized digital output signal y(n). As can be seen, output signal y(n) accurately represents the original input signal s(n) with a minimal amount of noise present therein.

As noted briefly above, the sub-Nyquist sampling of the input signal and subsequent spectrum reconstruction of said signal can result in certain sub-sampling defects, such as aliasing. However, it is to be understood that the identification of nonlinear artifacts (e.g., the cross-modulation of the target signal and one or more secondary signals) creates a form of signal diversity which, in turn, enables digital signal processor 119 to remedy said sub-sampling defects.

A simple example which is useful in understanding how digital signal processor 119 can use intermodulation products to remedy sub-sampling defects (e.g., aliasing) created as a result of the low sampling rate of ADC 117 is shown in FIGS. 8(a)–(d). Specifically, in FIG. 8(a), there is shown a sparse input signal 211 that is represented in the wideband spectrum B. Due to the sampling of ADC 117 at a sub-Nyquist rate (i.e., 2b), input signal 211 is represented in the narrowband spectrum b. As noted above, the sampling of input signal 211 at a sub-Nyquist rate provides significant improvement in the dynamic range of ADC 117, which is highly desirable.

Figure 8B:
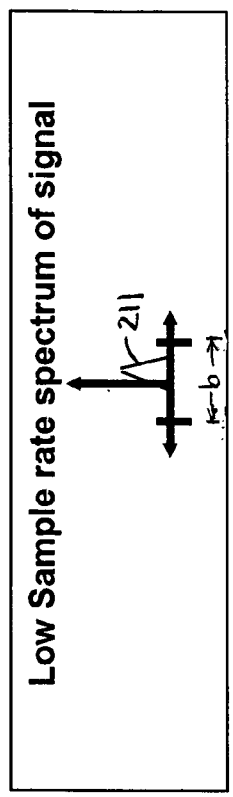
FIGS. 8(a)–(d) are graphical representations of a sample signal shown at various times during its transmission through the receiver system shown in FIG. 3, said graphical representations being useful in understanding how the digital signal processor in said receiver can use intermodulation products to remedy sub-sampling defects created as a result of the low sampling rate of the analog-to-digital converter.
Figure 8D:
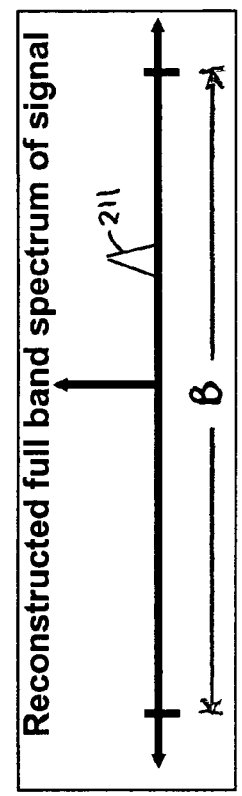
Figure 8A:
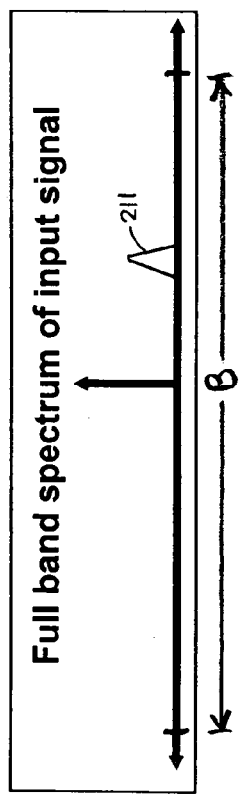
Figure 8C:
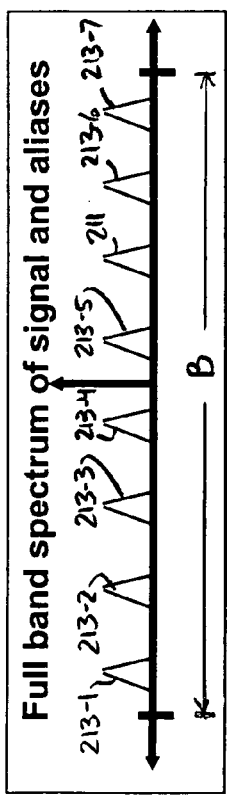

However, the narrowband representation of input signal 211 requires reconstruction back into wideband spectrum B (i.e., back into the full band spectrum of the input signal). Accordingly, FIG. 8(c) represents a reconstruction of the low sample rate spectrum of input signal 211 back into the full bandwidth spectrum. As can be seen, the spectrum expansion of input signal 211 creates a plurality of alias (i.e., copy) signals 213-1 through 213-7, each alias signal 213 appearing as a frequency-shifted version of the true signal 211. The particular number of alias signals 213 is a factor of the sub-Nyquist sampling rate of ADC 117 (e.g., a sampling rate which is beneath the Nyquist rate by a factor of eight will, in turn, create eight alias signals).

As can be appreciated, sub-Nyquist sampling can introduce a number of problems including (1) signal ambiguity—in other words, the inability to discern which of the eight apparent signals in FIG. 8(c) is the "true" signal 211 and (2) signal blending/overlap—in other words, the inability to separate out the "true" signal 211 from other signals (e.g., alias signals 213) which have been blended, or mixed, therewith (this condition not being shown in FIG. 8(c)). Regardless of the type of sub-sampling problem introduced, it is to be understood that the present invention resolves any/all sub-sampling problems using the above-described theory of signal diversity (i.e., using the information associated with nonlinear signal products, such as cross-modulation artifacts, to resolve said problems).

With respect to the signal ambiguity problem shown in FIG. 8(c), digital signal processor 119 engages in the process of hypothesis testing to locate the "true" signal 211. Specifically, processor 119 engages in a statistical analysis of each of the eight signals, one at a time, to determine which signal has the highest probability of being the "true" signal 211, the statistical analysis of each signal being performed using the measured artifacts of nonlinearity (e.g., measured intermodulation products). Based on the results of the hypothesis testing, digital signal processor 119 reconstructs the full band spectrum of the signal with only the highest probability signal 211 represented therein, as shown in FIG. 8(d).

Measured Results and Further Applications

It should be noted that actual performance results have been measured with respect to receiver 111 and are set forth in detail below. However, it is to be understood that the following results are being provided herewith for illustrative purposes only and are no way intended to limit the scope of the present invention.

As a direct result of the utilization of a sub-Nyquist sampling rate ADC of 100 million samples per second, receiver system 111 is able to achieve approximately 30 dBs of improvement in its dynamic range in comparison with more traditional receivers which utilize conventional off-the-shelf Nyquist rate ADCs (in the order of 1000 million samples per second). The aforementioned 30 dB improvement in dynamic range roughly corresponds to an improvement in receiver sensitivity by a factor of 1,000.

Furthermore, it should be noted that the present invention could serve as a springboard to a broad-based re-design of conventional nonlinear systems. For example, most receiver systems which are well-known in the art include one or more components that are traditionally optimized to minimize the presence of nonlinear distortion, said optimization often coming at a considerable expense in manufacturing costs. However, since the present invention exploits nonlinear distortion as a positive factor in improving system performance, it is to be understood that future systems may use highly nonlinear components and/or components that have actually been modified to increase its nonlinear behavior in order to improve system performance. The use of these types of highly nonlinear components can in turn result in considerable reductions in manufacturing costs, power requirements, component size and component weight, which are all highly desirable.

Figure 9:
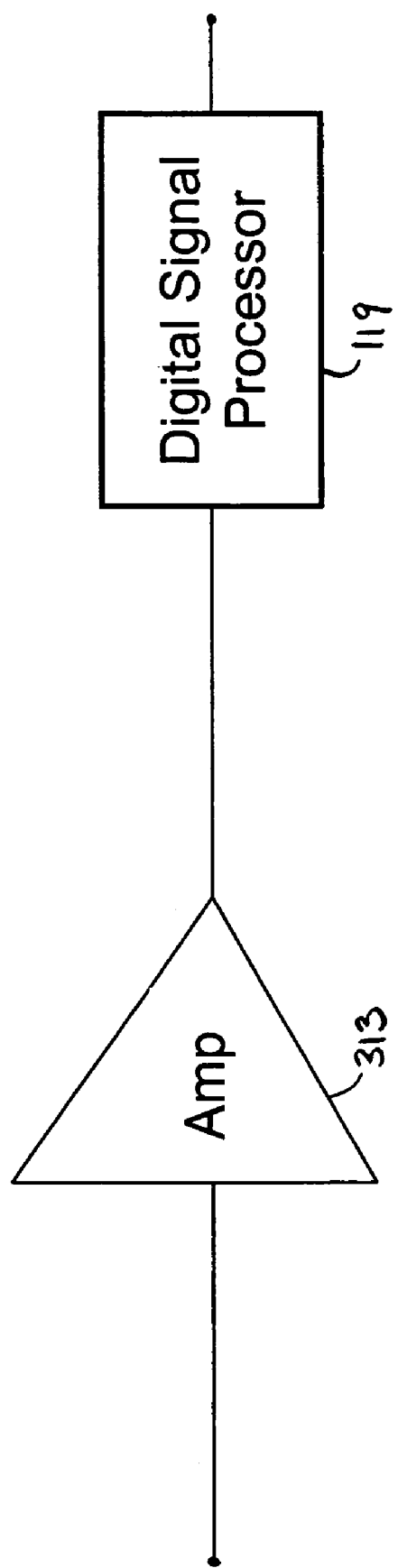
FIG. 9 is a simplified schematic representation of an amplifier system constructed according to the teachings of the present invention.

An additional application of the present invention is represented in FIG. 9. Specifically, there is shown an amplifier system constructed according to the teachings of the present invention and identified generally by reference numeral 311.

System 311 includes an amplifier 313 and digital signal processor 119. It should be noted that, if the noise level produced by amplifier 313 is equal to or greater than the strength of the output signal generated, said output signal would be effectively masked by the noise, which is highly undesirable. Typically in receiver systems, the noise generated by the front end amplifier dominates the noise in the receiver's output. Therefore, any noise related performance enhancement using the nonlinear affine methods as described herein must have the nonlinear cross-products created at or before said amplifier. In practice, these cross-products must be created by the amplifier itself since the target signal levels prior to the amplifier are typically too low and, as a consequence, adding any device prior to the amplifier would cause a significant addition to the noise of the system.

Accordingly, a secondary signal (e.g., internally or externally produced) may be injected into system 311. Due to the nonlinear behavior exhibited by amplifier 313 (which may be enhanced, if necessary), cross-modulation products are produced which can be identified by processor 119 (assuming that said cross-modulation products are stronger than the noise floor). In the manner as described above in conjunction with system 111, processor 119 utilizes said cross-modulation products to locate and strengthen (and potentially replace) the otherwise masked target signal, which is highly desirable.

The embodiments shown of the present invention are intended to be merely exemplary and those skilled in the art shall be able to make numerous variations and modifications to them without departing from the spirit of the present invention. All such variations and modifications are intended to be within the scope of the present invention as defined in the appended claims.

What is claimed is:

1. A method of nonlinear and affine signal processing, said method comprising the steps of:
   (a) introducing an analog input signal into a nonlinear system, the analog input signal being of a first bandwidth and including a target signal and a secondary signal,
   (b) identifying the nonlinear artifacts of the target signal and the secondary signal that are created as a result of the introduction of the analog input signal into the nonlinear system,
   (c) converting the analog input signal to a distorted digital output signal of a second bandwidth, wherein the second bandwidth is less than the first bandwidth,
   (d) expanding the distorted digital output signal from the second bandwidth to the first bandwidth, and (e) resolving signal expansion defects using the identified nonlinear artifacts.

2. The method of claim 1 wherein the secondary signal is substantially greater in strength than the target signal.

3. The method of claim 2 wherein said secondary signal is produced externally of said nonlinear system.

4. The method of claim 2 wherein said secondary signal is produced internally of said nonlinear system.

5. The method of claim 1 wherein said conversion step is performed using a sampling rate that is less than two times the first bandwidth.

6. The method of claim 1 wherein said resolving step is performed using hypothesis testing.

7. The method of claim 1 further comprising the step of modifying the nonlinear system so as to enhance its nonlinear behavior.

8. The method of claim 1 further comprising the step of, after said resolving step, minimizing the nonlinear component of the distorted digital output signal so as to yield an equalized digital output signal.

9. The method of claim 1 wherein said identification step is performed by transforming said distorted digital output signal into multiple dimensions.

10. A system for processing an analog input signal, the analog input signal comprising a target signal and a secondary signal, said system comprising:
(a) an analog-to-digital converter (ADC) having a sampling rate that falls substantially beneath the Nyquist rate, said ADC converting the analog input signal to a distorted digital output signal, and
(b) a digital signal processor for identifying the nonlinear artifacts of the target signal and the secondary signal,
(c) wherein said digital signal processor resolves sub-Nyquist sampling defects using the identified nonlinear artifacts.

11. The system as claimed in claim 10 wherein said system is a very wide bandwidth receiver.

12. The system as claimed in claim 10 further comprising a front end device for conditioning said analog input signal prior its conversion by the analog-to-digital converter.

13. The system as claimed in claim 12 further comprising an antenna for receiving said analog input signal.

14. A method of nonlinear and affine signal processing, said method comprising the steps of:
(a) introducing an input signal into a nonlinear system, the input signal including a target signal and a secondary signal, the introduction of the input signal into said nonlinear system yielding a distorted output signal which includes the target signal, the secondary signal and a nonlinear artifact of the target signal and the secondary signal,
(b) identifying the nonlinear artifact of the target signal and the secondary signal, and
(c) processing the target signal of the distorted output signal using the nonlinear artifact of the target signal and the secondary signal.

15. The method as claimed in claim 14 wherein, in said processing step, the target signal of the distorted output signal is enhanced using the nonlinear artifact.

16. The method as claimed in claim 15 wherein the distorted output signal yielded from the nonlinear system further includes a noise floor.

17. The method as claimed in claim 16 wherein, in said processing step, the target signal of the distorted output signal is strengthened relative to the noise floor using the nonlinear artifact.

18. The method as claimed in claim 14 wherein the introduction of the input signal into the nonlinear system yields a distorted digital output signal with at least one signal expansion defect.

19. The method as claimed in claim 18 wherein, in said processing step, the at least one signal expansion defect in the distorted digital output signal is resolved using the nonlinear artifact.

* * * * *